(12) United States Patent
Wang et al.

(10) Patent No.: US 6,674,639 B2
(45) Date of Patent: Jan. 6, 2004

(54) PROTECTIVE COVER WITH TERNARY STRUCTURE

(75) Inventors: Shih-Chieh Wang, Taipei (TW); James Tseng, Shulin (TW); Chien-Lung Huang, Taipei (TW); Hsi-Hsing Hsu, Taoyuan (TW); Chu-Yang Hsu, Hsinchu (TW); Yen-Te Chiang, Taipei (TW)

(73) Assignee: High Tech Computer, Corp. (TW)

( * ) Notice: Subject to any disclaimer, the term of this patent is extended or adjusted under 35 U.S.C. 154(b) by 18 days.

(21) Appl. No.: 10/050,554

(22) Filed: Jan. 18, 2002

(65) Prior Publication Data

US 2003/0043535 A1 Mar. 6, 2003

(30) Foreign Application Priority Data

Sep. 6, 2001 (TW) ........................................ 90122165 A

(51) Int. Cl.⁷ ................................................. G06F 1/16
(52) U.S. Cl. ....................................... 361/683; 361/686
(58) Field of Search ......................... 361/679, 683–686, 361/724; 345/903, 904

(56) References Cited

U.S. PATENT DOCUMENTS 5,058,045 A * 10/1991 Ma ............................ 361/683
5,574,625 A * 11/1996 Ohgami et al. ............. 361/684
6,193,069 B1 * 2/2001 Guenther et al. ........... 206/723

* cited by examiner

Primary Examiner—Anatoly Vortman
Assistant Examiner—Yean Hsi Chang
(74) Attorney, Agent, or Firm—Rabin & Berdo, PC

(57) ABSTRACT

A protective cover with ternary structure applied in an electronic product comprises a conjoint plate, a flexible plate connected to the conjoint plate, and a fastening plate connected to the flexible plate. The fastening plate snaps the bottom cover for covering the expansion slot of the electronic product. Also, the conjoint plate, the flexible plate, and the fastening plate are integrated as a whole by double injection technique, and the flexibility of the flexible plate controls the protective cover being closed or opened.

11 Claims, 1 Drawing Sheet

PROTECTIVE COVER WITH TERNARY STRUCTURE

This application incorporates by reference Taiwanese application Serial No. 90122165, filed Sep., 6, 2001.

BACKGROUND OF THE INVENTION

1. Field of the Invention

The invention relates in general to a protective cover applicable to the electronic products, and more particularly to a protective cover with a ternary structure, and the structural flexibility accomplishes the on-off condition of the cover.

2. Description of the Related Art

Today, computer, communication, and consumer (3C) products play a very important role in the global electronic industries. Since the life circle of modern electronic products is short, the trend of the modern product is leading to a handy design, which possesses less weight and good mechanical strength. With the rapid development of 3C products, the future market demands will be extremely massive for the portable products, such as laptop POs, cellular phones, Personal Digital Assistants (PDA), etc. Most electronic products are further equipped with expansion slots that are designed for offering add-ons, such as MP3 players or additional memory storage. However, the conventional protective cover designs for covering the expansion slots have failed to consider the portability of the products.

FIG. 1 is a perspective view of a conventional protective cover for a PDA expansion slot. The PDA 100 has a bottom cover 101 and a protective cover 110. The expansion slot (not shown in FIG. 1) is situated beneath the bottom cover 101, and is designed for inserting an additional memory card, such as a Compact Flash (CF) card. The protective cover 110, which is closed in FIG. 1, is designed for protecting the expansion slot. FIG. 2A is a cross-sectional view of the protective cover of FIG. 1. The protective cover 110 has a fastening portion 211 and a hinge 212. When the protective cover 110 is closed, it attaches firmly to the bottom cover 101 at the fastening portion 211. The hinge 212 is a jointed device that allows the rotating of the protective cover 110 on the bottom cover 101. However, if the user forgets to close the protective cover 110, the additional memory card may be dropped and missing, or the protective cover 110 may be damaged under careless impact. Also, this conventional design of the protective cover 110 does not operate smoothly, and the use of the hinge 212 increases the PDA production cost.

Currently, various protective cover designs are commercially available. FIG. 2B is a cross-sectional view of another conventional protective cover for the expansion slot. The protective cover 210 has a fastening portion 213 and an insertion portion 214. When the protective cover 210 is being closed, the insertion portion 214 is inserted into the recess of the bottom cover 201 and the fastening portion 211 attaches firmly to the bottom cover 201. Accordingly, the protective cover 210 can be attached to the opening of the expansion slot. When the expansion slot is needed, the protective cover 210 is lifted to make the fastening portion 213 and the insertion portion 214 unjoint. However, this design for separating the protective cover 210 and the bottom cover 201 is not very thoughtful. It is very possible for the unwary user to lose the protective cover 210 and need to buy a new one.

A further example of the conventional protective cover for the expansion slot is to weld the protective cover and the bottom cover. FIG. 2C is a cross-sectional view of a further conventional protective cover for the expansion slot. The protective cover 220, which also has a fastening portion 215, is made of a flexible material. Using the welded joint method, the protective cover 220 is connected to the bottom cover 204 by the welding end 216. When the expansion slot is needed, the fastening portion 215 is separated from the bottom cover 204, and the flexible protective cover 220 is then bent to open. In this case, the protective cover 220 is designed as an integrated part of the bottom cover 204 by welding. If the external force applied on the protective cover 220 disappears, the flexibility of the protective cover 220 allows it snap back to its original place. Therefore, these unpleasant situations, such as losing the protective cover and/or forgetting to close the protective cover, can be avoided. However, the material difference between the protective cover 220 and the bottom cover 204 weakens the welding strength, so that the protective cover 220 could break off if used frequently.

SUMMARY OF THE INVENTION

It is therefore an object of the invention to provide a protective cover with ternary structure for solving the problems of losing the cover or forgetting to close. Also, the protective cover of the invention has a better mechanical strength and the lower cost.

According to the objective of the invention, the protective cover with ternary structure applied in an electronic product, wherein the electronic product has an expansion slot and a bottom cover, comprises a conjoint plate connected to the bottom cover, a flexible plate connected to the conjoint plate, and a fastening plate connected to the flexible plate. The fastening plate also snaps the bottom cover for covering the expansion slot. Additionally, the conjoint plate, the flexible plate, and the fastening plate are integrated as a whole by double injection technique, and the flexibility of the flexible plate controls the protective cover being closed or opened.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 1:
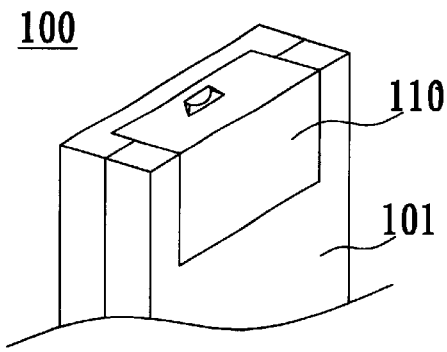
FIG. 1 (prior art) is a perspective view of a conventional protective cover for a PDA expansion slot.

In the present invention, three pieces of plates are adopted to construct a protective cover for the extension slot. The further details of the protective cover with ternary structure are described in the following paragraphs. Also, the dimensions of three pieces of plates in the drawing are not proportional. Accordingly, the specification and the drawing are to be regard in an illustrative sense rather than in a restrictive sense.

Figure 3:
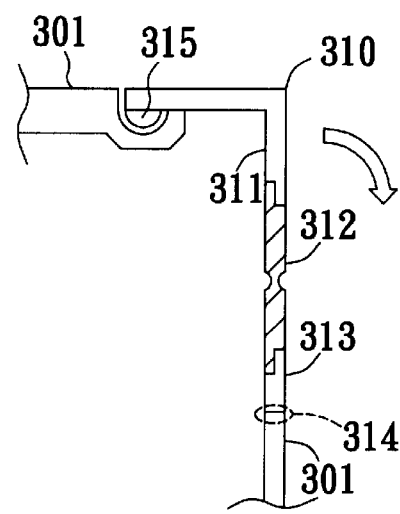
FIG. 3 is a cross-sectional view of a protective cover with a ternary structure according to the preferred embodiment of the invention.

FIG. 3 is a cross-sectional view of a protective cover a with ternary structure according to the preferred embodiment of the invention. The protective cover 310 for protecting the expansion slot is applicable to many electronic products, especially the Personal Digital Assistant (PDA). The expansion slot could be the slot for inserting a Compact Flash (CF) card or for placing the battery pack. The protective cover 310 with a ternary structure mainly includes a fastening plate 311, a flexible plate 312, and a conjoint plate 313. The conjoint plate 313, made of the same material as the bottom cover 301, is welded to the bottom cover 301. The flexible plate 312, made of flexible rubber, is connected to the conjoint plate 313 and provides the flexibility for opening the protective cover 310. The fastening plate 311, made of the same material as the conjoint plate 313, is connected to the flexible plate 312 and used for covering the expansion slot while the protective cover is closed. The materials of the fastening plate 311, the flexible plate 312, the bottom cover 301, and the conjoint plate 313 can be plastics or other materials that are easily injected. Also, the fastening plate 311, the flexible plate 312, and the conjoint plate 313 can be manufactured as a whole by the technique of double injection, so that each plate is well connected to the other plates. This technique overcomes the obstacles of welding the different materials.

Additionally, the fastening plate 311 is equipped with a fastening portion 315 for snapping the bottom cover 301. FIG. 3 shows a closed condition of the protective cover 310. When the protective cover 310 is required to be open, the fastening portion 315 has to first be released, and then an external force is used for twisting and opening the protective cover 310. If the external force disappears, the protective cover 310 will return back to the original place due to its own flexibility. Therefore, the unpleasant situations, such as missing the protective cover and/or forgetting to close the protective cover, can be avoided. Simply stated, the protective cover 310 being closed or opened is mainly controlled by the flexible plate 312.

Figure 2A:
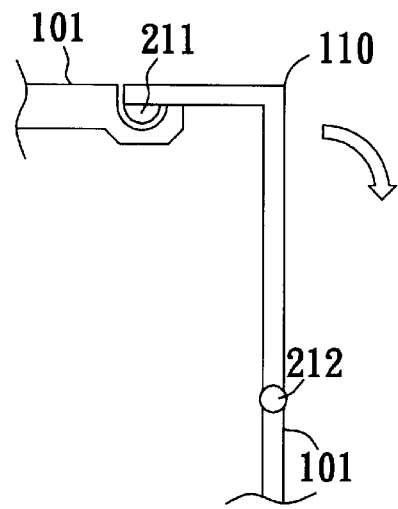
FIG. 2A (prior art) is a cross-sectional view of the protective cover of FIG. 1.
Figure 2B:
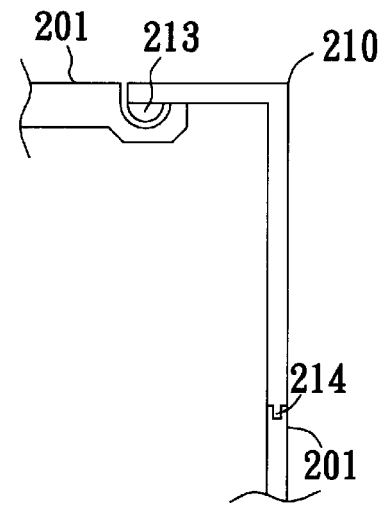
FIG. 2B (prior art) is a cross-sectional view of another conventional protective cover for the expansion slot.
Figure 2C:
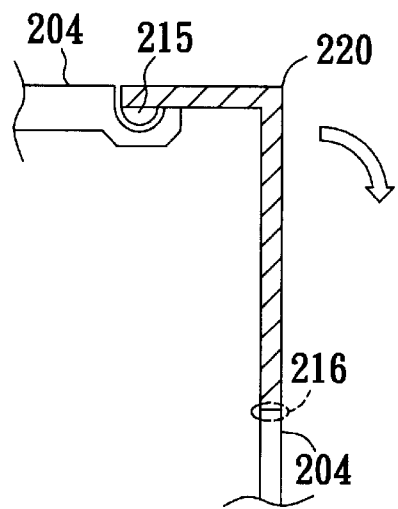
FIG. 2C (prior art) is a cross-sectional view of a further conventional protective cover for the expansion slot.

Furthermore, using the welded joint method, the conjoint plate 313 is connected to the bottom cover 301 by the welding end 314. Because the conjoint plate 313 and the bottom cover 301 are made of the same material, the strength of the welding end 314 is much better than that of joining the pieces with different materials. Besides, the elimination of a hinge apparatus (such as hinge 212 of FIG. 2A) decreases the production cost, and also make the operation more smooth.

According to the aforementioned descriptions, the protective cover with a ternary structure of the invention has several advantages, including:

(1) The protective cover welded to the bottom cover doesn't have the problem of loss;
(2) After the external force is gone, the protective cover will return back to the closed position due to its own flexibility. The thing (such as CF card) placed in the expansion slot is not going to be lost;
(3) The adjoining plates of the protective cover made of different materials is integrated as a whole by double injection technique. The binding strength between the plates is great;
(4) Since the conjoint plate and the bottom cover are made of the same material, the effect of welded joint between them is good; and
(5) The production cost is decreased due to the elimination of the hinge apparatus.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A protective cover with a ternary structure applied to an electronic product, wherein the electronic product has an expansion slot and a bottom cover, the protective cover comprising:

a conjoint plate connected to the bottom cover;
a flexible plate connected to the conjoint plate, a flexibility of the flexible plate controlling an opening and closing of the protective cover; and
a fastening plate connected to the flexible plate, and snapping with the bottom cover for covering the expansion slot;
wherein the flexible plate is formed by a material that is different from a material that forms the conjoint plate and the fastening plate; and wherein the conjoint plate, the flexible plate, and the fastening plate are integrated as a whole using a double injection technique.

2. The protective cover with ternary structure according to claim 1, wherein the electronic product is a Personal Digital Assistant (PDA).

3. The protective cover with ternary structure according to claim 1, wherein the flexible plate is made of rubber.

4. The protective cover with ternary structure according to claim 1, wherein the conjoint plate and the fastening plate are made of the same material.

5. The protective cover with ternary structure according to claim 4, wherein the conjoint plate and the fastening plate are made of plastics.

6. The protective cover with ternary structure according to claim 1, wherein the conjoint plate and the bottom cover are made of the same material.

7. The protective cover with ternary structure according to claim 6, wherein the conjoint plate is connected to the bottom cover by a welded joint.

8. The protective cover with ternary structure according to claim 6, wherein the conjoint plate and the bottom cover are made of plastics.

9. The protective cover with ternary structure according to claim 1, wherein the expansion slot is for inserting a Compact Flash Card.

10. The protective cover with ternary structure according to claim 1, wherein the expansion slot is for placing a battery pack.

11. A protective cover with a ternary structure applied to an electronic product, wherein the electronic product has a bottom cover, the protective cover comprising:

a conjoint plate connectable to the bottom cover;
a fastening plate that is movable between a closed position and an opened position; and
a resilient, flexible plate interposed between, and connected to, said conjoint plate and said fastening plate, and being formed of a material that is different from a material that forms said conjoint plate and said fastening plate;
wherein the resiliency of said flexible plate maintains said fastening plate in the closed position, and returns said fastening plate to the closed position after said fastening plate is moved to the opened position.

\* \* \* \* \*